United States Patent

Nakajima et al.

[11] Patent Number: 5,091,481
[45] Date of Patent: Feb. 25, 1992

[54] COMPOSITION OF POLYEPOXY COMPOUNDS, LINEAR POLYMER AND AROMATIC DIAMINE

[75] Inventors: Hiroyuki Nakajima; Takashi Takahama; Fumiyuki Miyamoto; Seiji Oka; Toshio Isooka, all of Amagasaki; Yoshihiro Maruyama, Sagamihara; Yasushi Yamamoto, Amagasaki, all of Japan

[73] Assignee: Mitsubishi Denki Kabushiki Kaisha, Tokyo, Japan

[21] Appl. No.: 379,333

[22] Filed: Jul. 13, 1989

[30] Foreign Application Priority Data

Jul. 20, 1988 [JP] Japan .................. 63-181209

[51] Int. Cl.$^5$ ............ C08L 63/02; C08L 63/07; C08L 67/02; C08L 79/08
[52] U.S. Cl. .................. 525/423; 525/438; 525/524; 525/527
[58] Field of Search ............ 525/524, 423, 438, 527

[56] References Cited

U.S. PATENT DOCUMENTS

| | | | |
|---|---|---|---|
| 4,390,664 | 6/1983 | Kanayama | 525/117 |
| 4,593,056 | 6/1986 | Qureshi et al. | 525/524 |
| 4,623,701 | 11/1986 | Massingill | 525/524 |
| 4,645,803 | 2/1987 | Kohli et al. | 525/524 |
| 4,912,179 | 3/1990 | Murakami et al. | 525/524 |

FOREIGN PATENT DOCUMENTS

| | | |
|---|---|---|
| 148493 | 7/1985 | European Pat. Off. |
| 264705 | 4/1988 | European Pat. Off. |
| 58-025327 | 2/1983 | Japan |
| 58-083032 | 5/1983 | Japan |
| 62-207322 | 9/1987 | Japan ................. 525/524 |

OTHER PUBLICATIONS

SAMPE Journal Jul./Aug. 1985, "Semi-2-Interpenetrating Polymer Networks of High Temperature Systems", Hanky et al., pp. 40-45.

Database WPIL, accession No. 87-295539, Derwent Publications Ltd., London, GB.** (Abstract of JP 62-207 322, of record).

*Primary Examiner*—Melvyn I. Marquis
*Assistant Examiner*—Robert E. L. Sellers, II
*Attorney, Agent, or Firm*—Oblon, Spivak, McClelland, Maier & Neustadt

[57] ABSTRACT

A resin composition for laminate, which comprises 100 parts by weight of a composition (B), from 0.5 to 10 parts by weight of dicyandiamide and from 1 to 100 parts by weight of a linear polymer, said composition (B) comprising (i) a composition (A) comprising from 20 to 80 parts by weight of a polyfunctional epoxy compound of the formula:

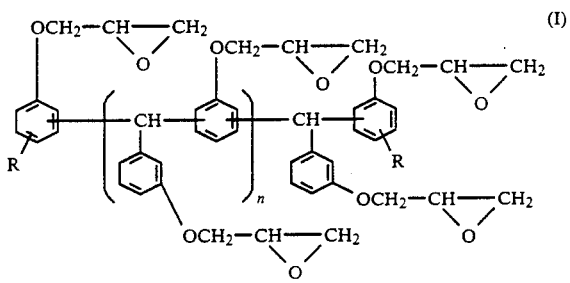

wherein R is H or $CH_3$ and n is an integer of from 0 to 5, and from 80 to 20 parts by weight of an epoxy compound having two epoxy groups in one molecule, and (ii) an aromatic diamino compound incorporated in the composition (A) in such an amount that its active hydrogen is from 0.3 to 0.8 equivalent per equivalent of terminal epoxy groups.

5 Claims, No Drawings

COMPOSITION OF POLYEPOXY COMPOUNDS, LINEAR POLYMER AND AROMATIC DIAMINE

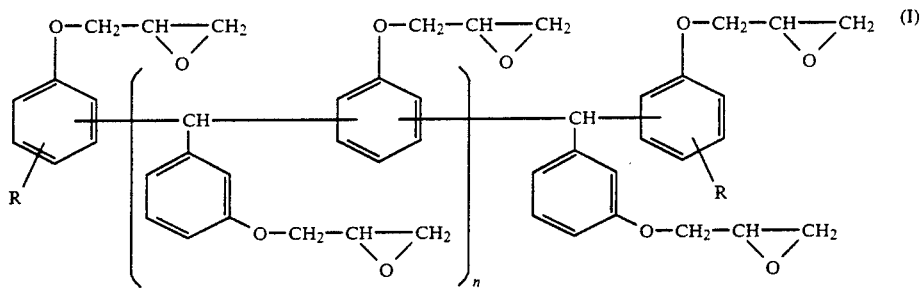

The present invention relates to a resin composition for laminate. More particularly, it relates to a resin composition for laminate which is excellent in heat resistance as well as in mechanical strength and adhesiveness.

The demand for laminates, particularly for copper-clad laminates, has increased remarkably. Copper-clad laminates suitable for various purposes have been produced by various combinations of the substrates and thermosetting resins. In the field of consumer electronic equipments such as color televisions or audio equipments, paper base phenol resin copper-clad laminates are mainly used. On the other hand, in the field of industrial electronic equipments such as computers, controlling devices or measuring devices, glass base epoxy resin copper-clad laminates are widely employed.

However, with the progress in the high density wiring and multi-layer lamination, conventional glass base epoxy resin copper-clad laminates can hardly satisfy the required specifications for e.g. dimensional stability and heat resistance. Therefore, it has been desired to develop a copper-clad laminate having excellent heat resistance.

As a copper-clad laminate excellent in the heat resistance, a combination of a polyimide resin (such as a polyaminobismaleimide resin) and a glass base material is disclosed in e.g. Japanese Examined Patent Publication No. 26423/1985. Such a laminate has a feature that the glass transition temperature is high and the dimensional stability is excellent even when heated.

However, such a polyimide resin has high moisture absorptivity and has a difficulty in the dimensional stability when heated in high humidity. Further, a polar solvent having a high boiling point is used as a solvent for the production of prepreg, and the solvent is likely to remain during the molding of a laminate, whereby there has been a drawback that the quality tends to be non-uniform. It has been desired to solve such difficulties.

The present invention has been accomplished against such background, and it is an object of the present invention to obtain a resin composition for laminate having excellent mechanical strength and adhesiveness and having heat resistance as excellent as the conventional product.

The present invention provides a resin composition for laminate, which comprises 100 parts by weight of a composition (B), from 0.5 to 10 parts by weight of dicyandiamide and from 1 to 100 parts by weight of a thermoplastic linear polymer, said composition (B) comprising (i) a composition (A) comprising from 20 to 80 parts by weight of a polyfunctional epoxy compound of the formula:

wherein R is H or CH$_3$ and n is an integer of from 0 to 5, and from 80 to 20 parts by weight of an epoxy compound having two epoxy groups in one molecule or a polyglycidyl ether of a novolak phenol-formaldehyde resin, and (ii) an aromatic diamino compound incorporated in the composition (A) in such an amount that its active hydrogen is from 0.3 to 0.8 equivalent per equivalent of terminal epoxy groups.

In the present invention, the composition (A) containing the polyfunctional epoxy compound as the main component is reacted with the aromatic diamino compound to increase the cross linking density and thereby improve the heat resistance, while the linear polymer is incorporated as a linear flexible component in the cross linked network structure to present toughness while maintaining the heat resistance. Further, as a curing agent for the epoxy compounds, dicyandiamide is incorporated in a predetermined amount relative to the aromatic diamino compound to facilitate the curing so that the flow properties of the prepreg resin during the preparation of laminates are optimized.

Now, the present invention will be described in detail with reference to the preferred embodiments.

The compound having two epoxy groups in one molecule to be used in the present invention is not particularly limited and may be, for example, a diglycidyl ether (such as Epikote 828, Epikote 1001, Epikote 1046, Epikote 5050, tradenames, manufactured by Shell Chemical Co.) obtainable by the reaction of bisphenol A and/or a halogenated bisphenol A with epichlorohydrin. Alternatively, there may be used a polyglycidyl ether of a novolak phenol-formaldehyde resin (such as DEN 438, tradename, manufactured by Dow Chemical Co., and EOCN 104 and BREN, tradenames, manufactured by Nippon Kayaku Co., Ltd.).

The aromatic diamino compound may be, for example, diaminodiphenyl ether, diaminodiphenylmethane, diaminodiphenylsulfone, diaminobenzanilide, p-phenylenediamine, m-phenylenediamine, dibromodiaminodiphenylmethane, dichlorodiaminodiphenylmethane, diaminobenzoguanamine or tetrabromodiaminodiphenylmethane.

In this invention, an imidazole or an imidazoline may be incorporated in an amount of from 0.01 to 5.0 parts by weight to facilitate the reaction. Typical examples of such an imidazole or an imidazoline include 2-methylimidazole, 2-ethyl-4-methylimidazole, 1-benzyl-2-methylimidazole, 2-ethyl-4-methylimidazoline and 2-methylimidazoline.

In the present invention, the polyfunctional epoxy compound of the formula I is used in an amount of from 20 to 80 parts by weight relative to 80 to 20 parts by weight of the epoxy compound having two epoxy groups or the polyglycidyl ether of a novolak phenol-formaldehyde resin in one molecule. If the amount is less than 20 parts by weight the cross linking density will not adequately increase, whereby the heat resistance will be inadequate. If the amount exceeds 80 parts by weight, the cross linking density tends to be too high, whereby the mechanical strength tends to be low.

The proportion of the aromatic diamino compound to the epoxy compounds is desired to be from 0.3 to 0.8 equivalent as represented by the active hydrogen equivalent per equivalent of terminal epoxy groups. If the proportion is less than 0.3 equivalent, the cross linking density will be inadequate, whereby the heat resistance will be inadequate. If the proportion exceeds 0.8 equivalent, the cross linking density tends to be too high, whereby the mechanical strength tends to be low.

The amount of dicyandiamide as a curing agent is desired to be from 0.5 to 10 parts by weight relative to 100 parts by weight of the epoxy compounds. If the amount is less than 0.5 part by weight, the reaction rate tends to be low, whereby it will be difficult to control the fluidity of the resin when used for prepreg for lamination. On the other hand, if the amount exceeds 10 parts by weight, the pot life tends to be short when used for prepreg for lamination.

As the linear polymer, polyethersulfone, polysulfone, polyetherimide, polyphenylene sulfide, polyester or a phenoxy resin may, for example, be suitably used. Usually, the molecular weight is preferably at least 3,000. If the molecular weight is less than 3,000, the effect for imparting flexibility by the high molecular weight tends to be hardly obtainable. The amount of the linear polymer is desired to be from 1 to 100 parts by weight. If the amount is less than 1 part by weight, the effect for imparting flexibility tends to be inadequate. If the amount exceeds 100 parts by weight, the resin viscosity tends to be too high, whereby impregnation into the substrate during the preparation of prepreg for lamination will be inadequate.

The resin composition for laminate thus prepared is usually dissolved in a solvent given below to obtain a resin solution having a predetermined concentration, which is then used for the preparation of prepreg.

The solvent to be used here may, for example, be an alcohol such as ethyl alcohol, propyl alcohol or butyl alcohol, an aromatic hydrocarbon such as benzene, toluene or xylene, a ketone such as acetone, methyl ethyl ketone or cylohexanone, an ether of ethylene glycol or diethylene glycol such as ethylene glycol monoethyl ether, ethylene glycol monoethyl ether, diethylene glycol monomethyl ether o ethylene glycol monoethyl ether acetate and its acetic acid ester. Further, an amide such as N,N'-dimethylformamide or N,N'-dimethylacetamide, or a polar solvent such as N-methylpyrrolidone, may also be employed.

As mentioned above, the resin composition for laminate is coated and impregnated to a predetermined substrate, followed by drying to obtain prepreg, and a copper foil is overlaid on this prepreg, followed by heating and pressing to obtain a copper-clad laminate.

As the substrate to be used here, glass fibers are most common. As other materials, aromatic polyamide fibers may be employed, and a mat shaped glass, polyester or aromatic polyamide may also be employed.

The resin composition for laminate is coated on a substrate usually at room temperature and dried at a temperature of from 80° to 200° C. for 1 to 20 minutes to obtain prepreg. A predetermined number of prepreg sheets are laminated, and a copper foil is overlaid at least on one side of the laminated assembly. Then, the assembly is heated and pressed usually at a temperature of from 80 to 250° C. under a pressure of from 5 to 100 kg/cm$^2$ for from 10 to 300 minutes to obtain a copper-clad laminate. Such conditions are preferred, and the conditions may not necessarily be limited to such specific conditions.

A laminate obtained by the resin composition of the present invention is excellent in the heat resistance, solder heat resistance and electrical properties and is suitable for use as a high density multi-layered laminate.

Now, the present invention will be described in further detail with reference to Examples. However, it should be understood that the present invention is by no means restricted to such specific Examples.

EXAMPLE 1

Sixty grams of an epoxy compound TACTIX (tradename, manufactured by Dow Chemical) represented by the formula:

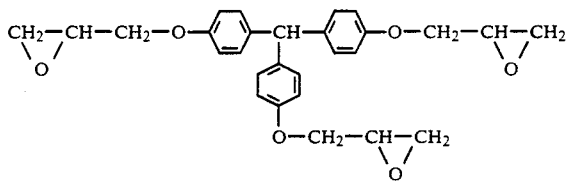

40 g of Epikote 5050 (tradename, manufactured by Shell Chemical Co.), 13 g of diaminodiphenylsulfone, 2 g of dicyandiamide, 10 g of a phenoxy resin having a molecular weight of 50,000 and 0.1 g of 2-ethyl-4-methylimidazole were mixed and dissolved in 77 g of ethylene glycol monomethyl ether to obtain a varnish for laminate as an embodiment of this invention having a concentration of 60%.

This varnish was impregnated to a woven glass fabric having a thickness of 0.18 mm and dried to obtain a prepreg having a resin content of 50% by weight. Four sheets of this prepreg were laminated, and a copper foil having a thickness of 35 μm was placed on each side of the laminated assembly, followed by press molding under heating. The molding conditions were a press temperature of 170° C., a pressing pressure of 40 kg/cm$^2$ and a pressing time of 60 minutes. The physical and electrical properties of the copper-clad laminate thus obtained were evaluated, and the results are shown in Table 1.

TABLE 1

| Items | Evaluation of copper-clad laminates | | | | |
| --- | --- | --- | --- | --- | --- |
| | Example 1 | Example 2 | Example 3 | Example 4 | Comparative Example 1 |
| Solder heat resistance (sec, 260° C.) | >300 | >300 | >300 | >300 | >300 |
| Copper foil adhesive | 1.5 | 1.6 | 1.5 | 1.4 | 0.8 |

TABLE 1-continued

| | Evaluation of copper-clad laminates | | | | |
|---|---|---|---|---|---|
| Items | Example 1 | Example 2 | Example 3 | Example 4 | Comparative Example 1 |
| strength (kg/cm, 200° C.) | | | | | |
| Insulation resistance (Ω) | $1.5 \times 10^{15}$ | $3.0 \times 10^{15}$ | $2.0 \times 10^{15}$ | $1.8 \times 10^{15}$ | $1.5 \times 10^{15}$ |
| Water absorptivity (%) | 0.10 | 0.15 | 0.15 | 0.12 | 0.40 |
| Thermal expansion coefficient ($10^{-6}$/°C.) | 45 | 50 | 48 | 45 | 40 |
| Flexural strength (kg/mm²) | 62 | 65 | 63 | 65 | 46 |
| Heat distortion temperature (°C.) | 210 | 220 | 200 | 215 | 235 |

The solder heat resistance, the copper foil adhesive strength, the insulation resistance and the water absorptivity were measured in accordance with JIS C-6481.
The thermal expansion coefficient, the flexural strength and the heat distortion temperature were measured in accordance with JIS K-6911.

EXAMPLE 2

Fifty grams of an epoxy compound EPPN 502 (tradename, manufactured by Nippon Kayaku Co., Ltd.) represented by the formula:

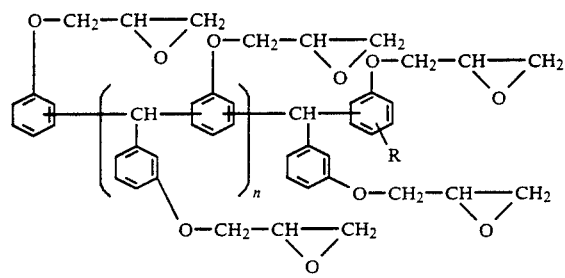

Where n = 1, 50 g of Epikote 5046B-80 (tradename, manufactured by Shell Chemical Co.), 10 g of diaminodiphenylsulfone, 3 g of diaminodiphenylmethane, 1 g of dicyandiamide, 20 g of a phenoxy resin having a molecular weight of 50,000 and 0.1 g of 2-ethyl-4-methylimidazole were mixed and dissolved in 50 g of ethylene glycol monoethyl ether to obtain a varnish for laminate as another embodiment of the present invention having a concentration of 60%. This varnish was impregnated to a woven glass fabric having a thickness of 0.18 mm and dried to obtain a prepreg having a resin content of 45% by weight. Four sheets of this prepreg were laminated and a copper foil having a thickness of 35 μm was placed to each side of the laminated assembly, followed by press molding under heating. The molding conditions were a press temperature of 170° C., a pressing pressure of 40 kg/cm² and a pressing time of 60 minutes.

The physical and electrical properties of the copper-clad laminate thus obtained were evaluated, and the results are shown in Table 1.

EXAMPLE 3

Fifty 9rams of an epoxy compound TACTIX (tradename, manufactured by Dow Chemical Co.), 50 9 of Epikote 1001 (tradename, manufactured by Yuka Shell Co.), 11.5 g of diaminodiphenylsulfone, 2 g of dicyandiamide, 40 g of polyetherimide and 0.1 g of 2-ethyl-4-methylimidazole were mixed and dissolved in 150 g of N,N-dimethylformamide and 60 g of ethylene glycol monoethyl ether to obtain a varnish for laminate as another embodiment of the present invention having a concentration of 42% by weight.

This varnish was impregnated to a woven glass fabric having a thickness of 0.18 mm and dried to obtain a prepreg having a resin content of 38% by weight. Four sheets of this prepreg were laminated, and a copper foil having a thickness of 35 μm was placed to each side of the laminated assembly, followed by press molding under heating. The molding conditions were a press temperature of 200° C., a pressing pressure of 40 kg/cm² and a pressing time of 60 minutes.

The physical and electrical properties of the copper-clad laminate thus obtained were evaluated, and the results are shown in Table 1.

EXAMPLE 4

As epoxy compounds, 20 g of EPPN 502 (tradename, manufactured by Nippon Kayaku Co., Ltd.) and 100 g of Epikote 5046B-80 (tradename, manufactured by Yuka Shell Co.), 5 g of diaminodiphenyl ether, 8 g of diaminodiphenylsulfone, 0.6 g of dicyandiamide, 10 g of polysulfone and 0.15 g of 2-phenylimidazole were mixed and dissolved in 140 g of ethylene glycol monoethyl ether to obtain a varnish for laminate as another embodiment of the present invention having a concentration of 50% by weight.

This varnish was impregnated to a woven glass fabric having a thickness of 0.18 mm and dried to obtain a prepreg having a resin content of 50% by weight.

Four sheets of this prepreg were laminated, and a copper foil having a thickness of 35 μm was placed to each side of the laminated assembly, followed by press molding under heating. The molding conditions were a press temperature of 200° C., a pressing pressure of 40 kg/cm² and a pressing time of 40 minutes..

The physical and electrical properties of the copper-clad laminate were evaluated, and the results are shown in Table 1.

COMPARATIVE EXAMPLE 1

One hundred grams of a polyimide resin Kelimide 601 (tradename, manufactured by Nippon Polyimide) was dissolved in 100 g of N-methylpyrrolidone to obtain a varnish for laminate having a concentration of 50% by weight.

This varnish was impregnated to a woven glass fabric having a thickness of 0.18 mm and dried at 150° C. for 30 minutes to obtain a prepreg having a resin content of 45% by weight.

Four sheets of this prepreg were laminated, and a copper foil having a thickness of 35 μm was placed to each side of the laminated assembly, followed by press molding under heating at 200° C. under a pressure of 40 kg/cm² for 90 minutes to obtain a copper-clad laminate. The copper-clad laminate thus obtained was evaluated, and the results are shown in Table 1.

As shown by the above Examples, the resin compositions for laminate of the present invention have excellent heat resistance at a level equal to the conventional product and have superior mechanical strength and adhesiveness.

As described in the foregoing, the present invention comprises 100 parts by weight of a composition (B), from 0.5 to 10 parts by weight of dicyandiamide and from 1 to 100 parts by weight of a linear polymer, said composition (B) comprising (i) a composition (A) comprising from 20 to 80 parts by weight of a polyfunctional epoxy compound of the formula:

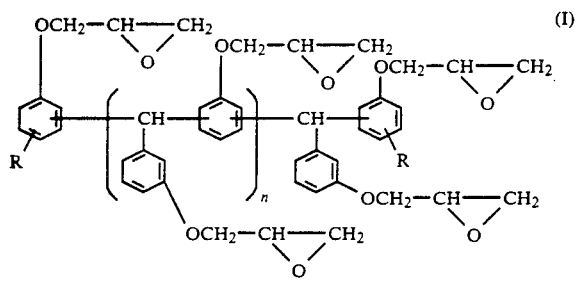

wherein R is H or CH₃ and n is an integer of from 0 to 5, and from 80 to 20 parts by weight of an epoxy compound having two epoxy groups in one molecule, and (ii) an aromatic diamino compound incorporated in the composition (A) in such an amount that its active hydrogen is from 0.3 to 0.8 equivalent per equivalent of terminal epoxy groups, whereby it is possible to obtain a resin composition for laminate having excellent heat resistance at a level of the conventional product and having excellent mechanical strength and adhesiveness, which is capable of providing, for example, a copper-clad laminate in combination with a copper foil.

We claim:

1. A resin composition for laminate, which comprises 100 parts by weight of a composition (B), from 0.5 to 10 parts by weight of dicyandiamide and from 1 to 100 parts by weight of a linear polymer, said composition (B) comprising (i) a composition comprising (a) from 20 to 80 parts by weight of a polyfunctional epoxy compound of the formula:

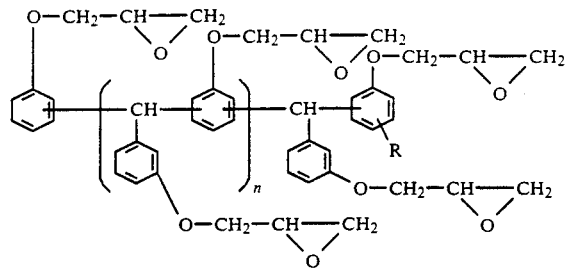

wherein R is H or CH₃ and n is an integer of from 0 to 5, and (b) from 80 to 20 parts by weight of an epoxy compound which is a diglycidyl ether obtained by reacting bisphenol A or halogenated bisphenol A with epichlorohydrin or is a polyglycidyl ether of a novolak phenol formaldehyde resin, and (ii) an aromatic diamino compound incorporated in the composition (i) in such an amount that its active hydrogen is from 0.3 to 0.8 equivalent per equivalent of terminal epoxy groups, and wherein the linear polymer is polyether sulfone, polysulfone, polyether imide, polyphenylene sulfide, polyester or a polyphenoxy resin.

2. The resin composition according to claim 1 wherein the aromatic diamino compound is diaminodiphenyl ether, diaminodiphenylmethane, diaminodiphenylsulfone, diaminobenzanilide, p-phenylenediamine, m-phenylenediamine, dibromodiaminodiphenylmethane, dichlorodiaminodiphenylmethane, diaminobenzoguanamine or tetrabromodiaminodiphenylmethane.

3. The resin composition according to claim 1, which further contains from 0.01 to 5.0 parts by weight of an imidazole or an imidazoline.

4. The resin composition according to claim 1 wherein the component (b) is a diglycidyl ether obtained by the reaction of a halogenated bisphenol A with epichlorohydrin and the thermoplastic linear polymer is a polyphenoxy resin.

5. The resin composition according to claim 4, which further contains from 0.01 to 5.0 parts by weight of an imidazole or imidazoline.

* * * * *